(12) United States Patent
Mizusaki et al.

(10) Patent No.: US 12,114,517 B2
(45) Date of Patent: Oct. 8, 2024

(54) LIGHT-EMITTING ELEMENT AND LIGHT-EMITTING DEVICE

(71) Applicant: SHARP KABUSHIKI KAISHA, Sakai (JP)

(72) Inventors: Masanobu Mizusaki, Sakai (JP); Hiroshi Tsuchiya, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 510 days.

(21) Appl. No.: 17/439,369

(22) PCT Filed: Mar. 22, 2019

(86) PCT No.: PCT/JP2019/012256
§ 371 (c)(1),
(2) Date: Sep. 14, 2021

(87) PCT Pub. No.: WO2020/194411
PCT Pub. Date: Oct. 1, 2020

(65) Prior Publication Data
US 2022/0158111 A1    May 19, 2022

(51) Int. Cl.
*H01L 33/26*     (2010.01)
*H10K 50/11*     (2023.01)
(Continued)

(52) U.S. Cl.
CPC .............. *H10K 50/11* (2023.02); *H01L 33/26* (2013.01); *H10K 50/156* (2023.02); *H10K 50/166* (2023.02); *H10K 59/122* (2023.02); *H10K 71/00* (2023.02); *H10K 2101/30* (2023.02); *H10K 2101/40* (2023.02)

(58) Field of Classification Search
CPC ......... H01L 33/26; H01L 33/00; H01L 33/02; H10K 50/11; H10K 50/156; H10K 50/166; H10K 59/122; H10K 71/00; H10K 2101/30; H10K 2101/40; H05B 33/14
See application file for complete search history.

(56) References Cited

U.S. PATENT DOCUMENTS 11,362,294 B2 * 6/2022 Li ...................... H10K 50/18
2013/0153881 A1    6/2013 Tokoo et al.
(Continued)

FOREIGN PATENT DOCUMENTS

WO    2012/039213 A1    3/2012

*Primary Examiner* — Shouxiang Hu
(74) *Attorney, Agent, or Firm* — ScienBiziP, P.C.

(57) ABSTRACT

In a light-emitting element, an energy level difference between a second hole transport layer and the light-emitting layer on a side closer to the second hole transport layer is greater than an energy level difference between the light-emitting layer on the side closer to the second hole transport layer and a layer in contact with a side closer to a cathode electrode of the light-emitting layer on the side closer to the second hole transport layer in LUMO level, and an energy level difference between a first electron transport layer and the light-emitting layer on a side closer to the first electron transport layer is greater than an energy level difference between the light-emitting layer on the side closer to the first electron transport layer and a layer in contact with a side closer to an anode electrode of the light-emitting layer on the side closer to the first electron transport layer in HOMO level.

14 Claims, 8 Drawing Sheets

(51) Int. Cl.
    *H10K 50/15*    (2023.01)
    *H10K 50/16*    (2023.01)
    *H10K 59/122*    (2023.01)
    *H10K 71/00*    (2023.01)
    *H10K 101/30*    (2023.01)
    *H10K 101/40*    (2023.01)

(56) References Cited

U.S. PATENT DOCUMENTS

| | | | |
|---|---|---|---|
| 2017/0012231 A1* | 1/2017 | Mishima | H10K 77/111 |
| 2017/0033308 A1* | 2/2017 | Mishima | H10K 50/165 |
| 2017/0054082 A1 | 2/2017 | Kim et al. | |

* cited by examiner

20 Fermi level, or the LUMO level and the HOMO level, of

LIGHT-EMITTING ELEMENT AND LIGHT-EMITTING DEVICE

TECHNICAL FIELD

The disclosure relates to a light-emitting element and a light-emitting device including the light-emitting element.

BACKGROUND ART

PTL 1 discloses a method for achieving high efficiency light emission of a light-emitting layer and suppression of deterioration of the light-emitting layer by adding dopants to each organic layer in an organic light-emitting device provided with an organic layer between electrodes.

CITATION LIST

Patent Literature

PTL 1: WO 2012/039213 A1

SUMMARY

Technical Problem

Even in the light-emitting device disclosed in PTL 1, a reduction in the luminous efficiency and shortening of lifespan of the light-emitting device occur due to the injection of carrier in organic layers injected from each electrode into the organic layers between the electrodes, or the bias of the carrier balance in the light-emitting layer.

Solution to Problem

In order to solve the above problem, the light-emitting element according to the disclosure is a light-emitting element including an anode electrode and a cathode electrode, the light-emitting element including: a first hole transport layer, a second hole transport layer, a light-emitting layer, a first electron transport layer, and a second electron transport layer between the anode electrode and the cathode electrode in order from a side closer to the anode electrode, wherein a value of a LUMO level of the second hole transport layer is greater than a value of a LUMO level of the light-emitting layer on a side closer to the second hole transport layer, and a value of a LUMO level of the light-emitting layer on a side closer to the first electron transport layer is equal to or greater than a value of a LUMO level of the first electron transport layer, a value of a HOMO level of the light-emitting layer on the side closer to the first electron transport layer is greater than a value of a HOMO level of the first electron transport layer, an energy level difference between the second hole transport layer and the light-emitting layer on the side closer to the second hole transport layer is greater than an energy level difference between the light-emitting layer on the side closer to the second hole transport layer and a layer in contact with a side closer to the cathode electrode of the light-emitting layer on the side closer to the second hole transport layer in LUMO level, and an energy level difference between the first electron transport layer and the light-emitting layer on the side closer to the first electron transport layer is greater than an energy level difference between the light-emitting layer on the side closer to the first electron transport layer and a layer in contact with a side closer to the anode electrode of the light-emitting layer on the side closer to the first electron transport layer in HOMO level.

Advantageous Effects of Disclosure

According to the configuration described above, a light-emitting element with extended lifespan and a light-emitting device provided with the light-emitting element can be provided in which the carrier injected from each electrode is transported to the light-emitting layer more efficiently, and the luminous efficiency is improved.

DESCRIPTION OF EMBODIMENTS

Figure 1:
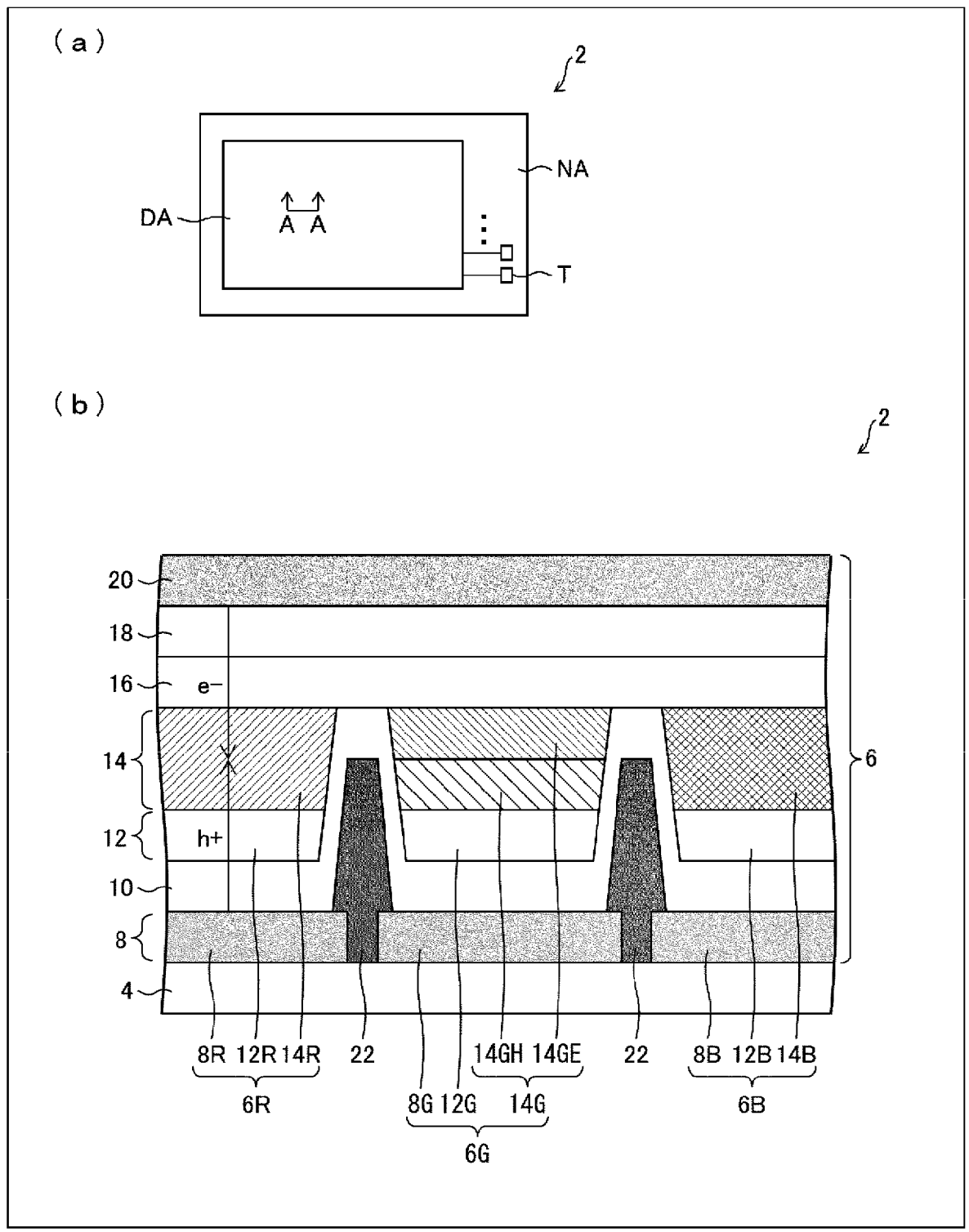
FIG. 1 is a schematic top view and a schematic cross-sectional view of a light-emitting device according to a first embodiment of the disclosure.

First Embodiment (a) of FIG. 1 is a schematic top view of a light-emitting device 2 according to the present embodiment, (b) of FIG. 1 is a cross-sectional view taken along a line A-A in the direction of the arrows in (a) of FIG. 1.

As illustrated in (a) of FIG. 1, the light-emitting device 2 according to the present embodiment includes a light-emitting region DA from which light emission is extracted and a frame region NA surrounding a periphery of the light-emitting region DA. In the frame region NA, a terminal T may be formed into which a signal for driving each light-emitting element of the light-emitting device 2 described in detail later is input.

In a position overlapping with the light-emitting region DA in a plan view, as illustrated in (b) of FIG. 1, the light-emitting device 2 according to the present embodiment includes an array substrate 4 and a light-emitting element layer 6 on the array substrate 4. In particular, the light-emitting device 2 has a structure in which respective layers of the light-emitting element layer 6 are laminated on the array substrate 4, in which a Thin Film Transistor (TFT; not illustrated) is formed. Note that, in the present specification, a direction from the light-emitting element layer 6 to the array substrate 4 of the light-emitting device 2 is referred to as "downward direction", and a direction from the light-emitting element layer 6 to the light-emitting face of the light-emitting device 2 is referred to as "upward direction".

The light-emitting element layer 6 includes, on an anode electrode 8, a first hole transport layer 10, a second hole transport layer 12, a light-emitting layer 14, a first electron transport layer 16, a second electron transport layer 18, and a cathode electrode 20, sequentially laminated from the lower layer. The anode electrode 8 of the light-emitting element layer 6 formed in an upper layer on the array substrate 4 is electrically connected with TFTs of the array substrate 4. Note that the light-emitting device 2 may include a capping layer or may include a sealing layer including a sealing material on the upper layer side of the cathode electrode 20.

In the present embodiment, the light-emitting element layer 6 includes a light-emitting element 6R, a light-emitting element 6G, and a light-emitting element 6B. The light-emitting element 6R, the light-emitting element 6G, and the light-emitting element 6B may be organic EL elements, that is, OLED elements, in which the light-emitting layer 14 includes an organic fluorescent material or an organic phosphorescent material. In addition to this, the light-emitting element 6R, the light-emitting element 6G, and the light-emitting element 6B may be QLED elements in which the light-emitting layer 14 includes a semiconductor nanoparticle material, that is, a quantum dot material. However, in the present embodiment, various light-emitting elements, without being limited to the OLED elements or the QLED elements, can be used for the light-emitting element 6R, the light-emitting element 6G, and the light-emitting element 6B.

Here, each of the anode electrode 8, the second hole transport layer 12, and light-emitting layer 14 is separated by edge covers 22. In particular, in the present embodiment, the anode electrode 8 is separated into an anode electrode 8R for the light-emitting element 6R, an anode electrode 8G for the light-emitting element 6G, and an anode electrode 8B for the light-emitting element 6B by the edge covers 22. The second hole transport layer 12 is separated into a second hole transport layer 12R for the light-emitting element 6R, a second hole transport layer 12G for the light-emitting element 6G, and a second hole transport layer 12B for the light-emitting element 6B by the edge covers 22. Furthermore, the light-emitting layer 14 is separated into a light-emitting layer 14R, a light-emitting layer 14G, and a light-emitting layer 14B by the edge covers 22.

Furthermore, the light-emitting layer 14G includes a first light-emitting layer 14GH and a second light-emitting layer 14GE laminated from the anode electrode 8 side. The first light-emitting layer 14GH is a hole transport type light-emitting layer, and the second light-emitting layer 14GE is an electron transport type light-emitting layer.

Note that the first hole transport layer 10, the first electron transport layer 16, the second electron transport layer 18, and the cathode electrode 20 are not separated by the edge covers 22, and are formed in common.

As illustrated in (b) of FIG. 1, the edge covers 22 may be formed in positions covering the side surfaces and the vicinity of the peripheral end portions of the upper faces of the anode electrode 8.

In the present embodiment, the light-emitting element 6R includes the anode electrode 8R, the first hole transport layer 10, the second hole transport layer 12R, the light-emitting layer 14R, the first electron transport layer 16, the second electron transport layer 18, and the cathode electrode 20. The light-emitting element 6G includes the anode electrode 8G, the first hole transport layer 10, the second hole transport layer 12G, the light-emitting layer 14G, the first electron transport layer 16, the second electron transport layer 18, and the cathode electrode 20. Furthermore, the light-emitting element 6B includes the anode electrode 8B, the first hole transport layer 10, the second hole transport layer 12B, the light-emitting layer 14B, the first electron transport layer 16, the second electron transport layer 18, and the cathode electrode 20.

In the present embodiment, the light-emitting layer 14R, the light-emitting layer 14G, and the light-emitting layer 14B emit red light, green light, and blue light, respectively. In other words, the light-emitting element 6R, the light-emitting element 6G, and the light-emitting element 6B are light-emitting elements that emit the red light, the green light, and the blue light, respectively.

Here, the blue light is, for example, light having a light emission center wavelength in a wavelength band of 400 nm or more and 500 nm or less. The green light is, for example, light having a light emission center wavelength in a wavelength band of greater than 500 nm and 600 nm or less. The red light is, for example, light having a light emission center wavelength in a wavelength band of greater than 600 nm and 780 nm or less.

In the present embodiment, the light-emitting layer 14R and the light-emitting layer 14B are in contact with the second hole transport layer 12 on the anode electrode 8 side and the first electron transport layer 16 on the cathode electrode 20 side. In other words, the single layer light-emitting layer 14R and the light-emitting layer 14B are in contact with both the second hole transport layer 12 and the first electron transport layer 16.

On the other hand, the first light-emitting layer 14GH is in contact with the second hole transport layer 12 on the anode electrode 8 side, and is in contact with the second light-emitting layer 14GE on the cathode electrode 20 side. The second light-emitting layer 14GE is in contact with the first light-emitting layer 14GH on the anode electrode 8 side and is in contact with the first electron transport layer 16 on the cathode electrode 20 side.

Note that the light-emitting device 2 according to the present embodiment is not limited to the configuration described above, and other layers may be provided either between the second hole transport layer 12 and the light-emitting layer 14, or between the light-emitting layer 14 and the first electron transport layer 16.

The anode electrode 8 and the cathode electrode 20 include conductive materials and are electrically connected to the first hole transport layer 10 and the second electron transport layer 18, respectively. Of the anode electrode 8 and the cathode electrode 20, the electrode closer to the light-emitting face of the light-emitting device 2 is a semitransparent electrode.

The anode electrode 8 has a configuration in which ITO (Indium Tin Oxide) is laminated on, for example, an Ag—Pd—Cu alloy. The anode electrode 8 having the above configuration is a reflective electrode that reflects light emitted from the light-emitting layer 14. Thus, among the light emitted from the light-emitting layer 14, light directed in the downward direction can be reflected by the anode electrode 8.

On the other hand, the cathode electrode 20 is configured by, for example, a semi-transparent Mg—Ag alloy. In other words, the cathode electrode 20 is a transmissive electrode that transmits light emitted from the light-emitting layer 14. Thus, among the light emitted from the light-emitting layer 14, light directed in the upward direction passes through the cathode electrode 20. In this manner, the light-emitting device 2 can emit the light emitted from the light-emitting layer 14 in the upward direction.

As described above, in the light-emitting device 2, both the light emitted in the upward direction and the light emitted in the downward direction from the light-emitting layer 14 can be directed toward the cathode electrode 20 (upward direction). That is, the light-emitting device 2 is configured as a top-emitting type light-emitting device.

In the present embodiment, the cathode electrode 20, which is a semitransparent electrode, may partially reflect the light emitted from the light-emitting layer 14. In addition, a cavity of the light emitted from the light-emitting layer 14 may be formed between the anode electrode 8, which is a reflective electrode, and the cathode electrode 20, which is a semitransparent electrode. By forming the cavity between the anode electrode 8 and the cathode electrode 20, the chromaticity of the light emitted from the light-emitting layer 14 can be improved.

Note that the configuration of the anode electrode 8 and the cathode electrode 20 described above is an example, and may be another configuration.

The light-emitting layer 14 is a layer that emits light as a result of an occurrence of recombination between the positive holes transported from the anode electrode 8 and the electrons transported from the cathode electrode 20. Note that in the light-emitting element 6G, the positive holes transported to the first light-emitting layer 14GH and the electrons transported to the second light-emitting layer 14GE are transported to the interface between the first light-emitting layer 14GH and the second light-emitting layer 14GE, and recombine in the vicinity of the interface.

The first hole transport layer 10 and the second hole transport layer 12 are layers that transport positive holes from the anode electrode 8 to the light-emitting layer 14. The second hole transport layer 12 may have a function of inhibiting transport of electrons from the cathode electrode 20. The first electron transport layer 16 and the second electron transport layer 18 are layers that transport electrons from the cathode electrode 20 to the light-emitting layer 14. The first electron transport layer 16 may have a function of inhibiting transport of positive holes from the anode electrode 8.

The first hole transport layer 10, the second hole transport layer 12, the light-emitting layer 14, the first electron transport layer 16, and the second electron transport layer 18 may be formed by a known technique, and may be formed by, for example, vapor deposition using a vapor deposition mask.

Note that the light-emitting device 2 according to the present embodiment may include a hole injection layer (not illustrated) including a hole injection material between the anode electrode 8 and the first hole transport layer 10. Similarly, the light-emitting device 2 according to the present embodiment may include an electron injection layer (not illustrated) including an electron injection material between the cathode electrode 20 and the second electron transport layer 18.

Figure 2:
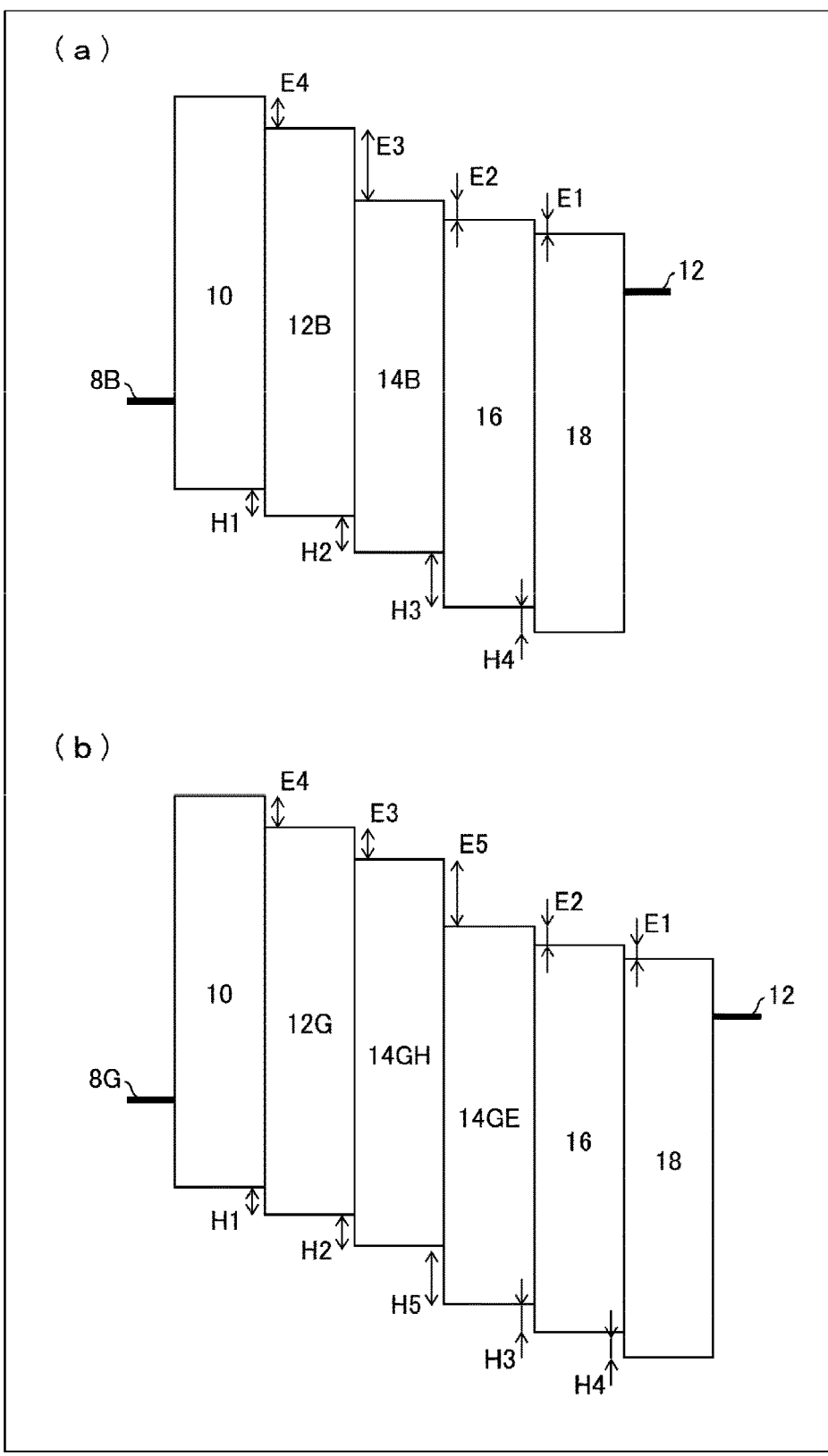
FIG. 2 is an energy diagram illustrating an example of the Fermi level, or the LUMO level and the HOMO level, of each layer in the light-emitting elements of the light-emitting device according to the first embodiment of the disclosure.

Next, an energy band in each layer of each light-emitting element included in the light-emitting element layer 6 of the light-emitting device 2 according to the present embodiment will be described with reference to FIG. 2. (a) of FIG. 2 is an energy band diagram illustrating an example of the Fermi level or the band gap in each layer of the light-emitting element 6B of the light-emitting device 2 according to the present embodiment. (b) of FIG. 2 is an energy band diagram illustrating an example of the Fermi level or the band gap in each layer of the light-emitting element 6G of the light-emitting device 2 according to the present embodiment.

Note that in the energy band diagram of the present specification, the energy level of each layer with respect to the vacuum level is indicated. In the energy band diagram of the present specification, the Fermi level or band gap of each member corresponding to the indicated member number is indicated. The Fermi levels are indicated for the anode electrode 8 and the cathode electrode 20, and the band gaps from the LUMO level to the HOMO level are indicated for the first hole transport layer 10, the second hole transport layer 12, the light-emitting layer 14, the first electron transport layer 16, and the second electron transport layer 18.

Here, the difference between the HOMO level and the LUMO level between each layer in the light-emitting element layer 6 according to the present embodiment will be described with reference to FIG. 2. In the present specification, a value obtained by subtracting the value of the HOMO level of the second layer from the value of the HOMO level of the first layer is referred to as an energy level difference between the HOMO level of the first layer and the HOMO level of the second layer. On the other hand, in the present specification, a value obtained by subtracting the value of the LUMO level of the first layer from the value of the LUMO level of the second layer is referred to as an energy level difference between the LUMO level of the first layer and the LUMO level of the second layer.

In FIG. 2, H1 indicates the energy level difference between the HOMO level of the first hole transport layer 10 and the HOMO level of the second hole transport layer 12 in each light-emitting element. H2 indicates the energy level difference between the HOMO level of the second hole transport layer 12 and the HOMO level of the light-emitting layer 14 in each light-emitting element. H3 indicates the energy level difference between the HOMO level of the light-emitting layer 14 and the HOMO level of the first electron transport layer 16 in each light-emitting element. H4 indicates the energy level difference between the HOMO level of the first electron transport layer 16 and the HOMO level of the second electron transport layer 18 in each light-emitting element.

In FIG. 2, E1 indicates the energy level difference between the LUMO level of the second electron transport layer 18 and the LUMO level of the first electron transport layer 16 in each light-emitting element. E2 indicates the energy level difference between the LUMO level of the first electron transport layer 16 and the LUMO level of the light-emitting layer 14 in each light-emitting element. E3 indicates the energy level difference between the LUMO level of the light-emitting layer 14 and the LUMO level of the second hole transport layer 12 in each light-emitting element. E4 indicates the energy level difference between the LUMO level of the second hole transport layer 12 and the LUMO level of the first hole transport layer 10 in each light-emitting element.

In particular, the energy level difference H2 in (b) of FIG. 2 indicates the energy level difference between the HOMO level of the second hole transport layer 12G and the HOMO level of the first light-emitting layer 14GH in the light-emitting element 6G. The energy level difference E2 in (b) of FIG. 2 indicates the energy level difference between the LUMO level of the first electron transport layer 16 and the LUMO level of the second light-emitting layer 14GE in the light-emitting element 6G.

In (b) of FIG. 2, H5 indicates the energy level difference between the HOMO level of the first light-emitting layer 14GH and the HOMO level of the second light-emitting layer 14GE in the light-emitting element 6G. E5 indicates the energy level difference between the LUMO level of the second light-emitting layer 14GE and the LUMO level of the first light-emitting layer 14GH in the light-emitting element 6G.

In the light-emitting element 6B according to the present embodiment, as illustrated in (a) of FIG. 2, the value of the HOMO level of the first hole transport layer 10 is greater than the value of the HOMO level of the second hole transport layer 12B. The value of the HOMO level of the light-emitting layer 14B is greater than the value of the HOMO level of the first electron transport layer 16. Note that as illustrated in (a) of FIG. 2, the value of the HOMO level of the second hole transport layer 12B may be greater than the value of the HOMO level of the light-emitting layer 14B.

In addition, in the light-emitting element 6B, the energy level difference H3 is greater than the energy level difference H2. In other words, in the light-emitting element 6B, the energy level difference between the light-emitting layer 14B and the first electron transport layer 16 in the HOMO level is greater than the energy level difference between the second hole transport layer 12B and the light-emitting layer 14B. Thus, compared to a case where the energy level difference H2 is greater than the energy level difference H3, the hole injection from the second hole transport layer 12B into the light-emitting layer 14B occurs significantly over the hole injection from the light-emitting layer 14B into the first electron transport layer 16.

Thus, the light-emitting element 6B according to the present embodiment makes positive holes injected from the anode electrode 8 into the first hole transport layer 10 to reach the light-emitting layer 14B more efficiently, and reduces the outflow of positive holes from the light-emitting layer 14B toward the cathode electrode 20 side more efficiently.

Similarly, in the light-emitting element 6B according to the present embodiment, as illustrated in (a) of FIG. 2, the value of the LUMO level of the first electron transport layer 16 is greater than the value of the LUMO level of the second electron transport layer 18. The value of the LUMO level of the light-emitting layer 14B is greater than the value of the LUMO level of the first electron transport layer 16. Furthermore, the value of the LUMO level of the second hole transport layer 12B is greater than the value of the LUMO level of the light-emitting layer 14B.

In addition, in the light-emitting element 6B, the energy level difference E3 is greater than the energy level difference E2. In other words, in the light-emitting element 6B, the energy level difference between the second hole transport layer 12B and the light-emitting layer 14B in the LUMO level is greater than the energy level difference between the light-emitting layer 14B and the first electron transport layer 16. Thus, compared to a case where the energy level difference E2 is greater than the energy level difference E3, the electron injection from the first electron transport layer 16 into the light-emitting layer 14B occurs significantly over the electron injection from the light-emitting layer 14B to the second hole transport layer 12B.

Thus, the light-emitting element 6B according to the present embodiment makes electrons injected from the cathode electrode 20 into the second electron transport layer 18 to reach the light-emitting layer 14B more efficiently, and reduces the outflow of electrons from the light-emitting layer 14B toward the anode electrode 8 side more efficiently.

As described above, the light-emitting element 6B according to the present embodiment reduces the retention of positive holes from the anode electrode 8 and electrons from the cathode electrode 20 in each layer of the light-emitting element 6B, and more efficiently causes recombination between the positive holes and electrons in the light-emitting layer 14B. For this reason, the lifespan of the light-emitting element 6B becomes longer because the retention of the carrier, which causes deterioration of each layer of the light-emitting element 6B, is reduced. Recombination between the positive holes and electrons in the light-emitting layer 14B occurs more efficiently, so the luminous efficiency of the light-emitting element 6B is improved.

In the light-emitting element 6B according to the present embodiment, both the energy level difference H1 and the energy level difference H2 are preferably not less than 0.0 eV and not greater than 0.15 eV. That is, both the energy level difference between the first hole transport layer 10 and the second hole transport layer 12B and the energy level difference between the light-emitting layer 14B and the second hole transport layer 12B in the HOMO level are preferably not less than 0.0 eV and not greater than 0.15 eV. According to the configuration described above, the positive holes from the anode electrode 8 can be reduced from remaining in the first hole transport layer 10 or the second hole transport layer 12B, and the positive holes can be transported to the light-emitting layer 14B more efficiently.

In the light-emitting element 6B according to the present embodiment, the energy level difference H3 is preferably 0.25 eV or greater, and more preferably 0.45 eV or greater. In other words, the energy level difference between the light-emitting layer 14B and the first electron transport layer 16 in the HOMO level is preferably 0.25 eV or greater, and more preferably 0.45 eV or greater. According to the configuration described above, the outflow of positive holes from the light-emitting layer 14B toward the cathode electrode 20 side can be reduced more efficiently, and the density of the positive holes in the light-emitting layer 14B is improved.

Similarly, in the light-emitting element 6B according to the present embodiment, both the energy level difference E1 and the energy level difference E2 are preferably not less than 0.0 eV and not greater than 0.15 eV. In other words, both the energy level difference between the first electron transport layer 16 and the second electron transport layer 18 and the energy level difference between the light-emitting layer 14B and the first electron transport layer 16 in the LUMO level are preferably not less than 0.0 eV and not greater than 0.15 eV. According to the configuration described above, the electrons from the cathode electrode 20 can be reduced from remaining in the first electron transport layer 16 or the second electron transport layer 18, and the electrons can be transported to the light-emitting layer 14B more efficiently.

In the light-emitting element 6B according to the present embodiment, the energy level difference E3 is preferably 0.25 eV or greater, and more preferably 0.45 eV or greater. In other words, the energy level difference between the light-emitting layer 14B and the second hole transport layer 12B in the LUMO level is preferably 0.25 eV or greater, and more preferably 0.45 eV or greater. According to the configuration described above, the outflow of electrons from the light-emitting layer 14B toward the anode electrode 8 side can be reduced more efficiently, and the density of electrons in the light-emitting layer 14B is improved.

In the light-emitting element 6B, recombination between the positive holes and electrons occurs in the light-emitting layer 14B. For this reason, light having energy corresponding to a difference between the value of the LUMO level of the light-emitting layer 14B and the value of the HOMO level of the light-emitting layer 14B is generated from the light-emitting layer 14B. The difference between the value of the LUMO level of the light-emitting layer 14B and the value of the HOMO level of the light-emitting layer 14B is preferably greater than 2.7 eV and less than or equal to 3.1 eV.

In the light-emitting element 6B, the value of the HOMO level of the first electron transport layer 16 may be greater than the value of the HOMO level of the second electron transport layer 18. As a result, the energy level difference H4 from the first electron transport layer 16 to the second electron transport layer 18 is present in the light-emitting element 6B. Thus, according to the configuration described above, the light-emitting element 6B can further reduce the outflow of positive holes from the light-emitting layer 14B toward the cathode electrode 20 side.

In addition, in the light-emitting element 6B, the value of the LUMO level of the first hole transport layer 10 may be greater than the value of the LUMO level of the second hole transport layer 12B. As a result, the energy level difference E4 from the second hole transport layer 12B to the first hole transport layer 10 is present in the light-emitting element 6B. Thus, according to the configuration described above, the light-emitting element 6B can further reduce the outflow of electrons from the light-emitting layer 14B toward the anode electrode 8 side.

Note that the light-emitting element 6R according to the present embodiment may have the same configuration as the light-emitting element 6B except that the light from the light-emitting layer 14R is red light. For example, the magnitude relationship between the value of the LUMO level and the value of the HOMO level of each layer of the light-emitting element 6R may be the same as that of the light-emitting element 6B. In the light-emitting element 6R, the energy level difference H3 may be greater than the energy level difference H2, and the energy level difference E3 may be greater than the energy level difference E2. For this reason, even in the light-emitting element 6R, the lifespan becomes longer, and the luminous efficiency is improved.

Next, in the light-emitting element 6G according to the present embodiment, as illustrated in (b) of FIG. 2, the value of the HOMO level of the first hole transport layer 10 is greater than the value of the HOMO level of the second hole transport layer 12G. The value of the HOMO level of the first light-emitting layer 14GH is greater than the value of the HOMO level of the second light-emitting layer 14GE. Note that as illustrated in (b) of FIG. 2, the value of the HOMO level of the second hole transport layer 12G may be greater than the value of the HOMO level of the first light-emitting layer 14GH.

In addition, in the light-emitting element 6G, the energy level difference H5 is greater than the energy level difference H2. In other words, in the light-emitting element 6G, the energy level difference between the first light-emitting layer 14GH and the second light-emitting layer 14GE in the HOMO level is greater than the energy level difference between the second hole transport layer 12G and the first light-emitting layer 14GH. Thus, compared to a case where the energy level difference H2 is greater than the energy level difference H5, the hole injection from the second hole transport layer 12G into the first light-emitting layer 14GH occurs significantly over the hole injection from the first light-emitting layer 14GH into the second light-emitting layer 14GE.

Thus, the light-emitting element 6G according to the present embodiment makes positive holes injected from the anode electrode 8 into the first hole transport layer 10 to reach the first light-emitting layer 14GH more efficiently, and reduces the outflow of positive holes from the first light-emitting layer 14GH toward the cathode electrode 20 side more efficiently.

Similarly, in the light-emitting element 6G according to the present embodiment, as illustrated in (b) of FIG. 2, the value of the LUMO level of the first electron transport layer 16 is greater than the value of the LUMO level of the second electron transport layer 18. The value of the LUMO level of the second light-emitting layer 14GE is greater than the value of the LUMO level of the first electron transport layer 16. Furthermore, the value of the LUMO level of the first light-emitting layer 14GH is greater than the value of the LUMO level of the second light-emitting layer 14GE.

In addition, in the light-emitting element 6G, the energy level difference E5 is greater than the energy level difference E2. In other words, in the light-emitting element 6G, the energy level difference between the first light-emitting layer 14GH and the second light-emitting layer 14GE in the LUMO level is greater than the energy level difference between the second light-emitting layer 14GE and the first electron transport layer 16. Thus, compared to a case where the energy level difference E2 is greater than the energy level difference E5, the electron injection from the first electron transport layer 16 into the second light-emitting layer 14GE occurs significantly over the electron injection from the second light-emitting layer 14GE into the first light-emitting layer 14GH.

Thus, the light-emitting element 6G according to the present embodiment makes electrons injected from the cathode electrode 20 into the second electron transport layer 18 to reach the second light-emitting layer 14GE more efficiently, and reduces the outflow of electrons from the second light-emitting layer 14GE toward the anode electrode 8 side more efficiently.

As described above, the light-emitting element 6G according to the present embodiment reduces the retention of positive holes from the anode electrode 8 and electrons from the cathode electrode 20 in each layer of the light-emitting element 6G, and more efficiently causes recombination between the positive holes and electrons at the interface between the first light-emitting layer 14GH and the second light-emitting layer 14GE. For this reason, the lifespan of the light-emitting element 6G becomes longer because the retention of the carrier, which causes deterioration of each layer of the light-emitting element 6G, is reduced. Recombination between the positive holes and electrons occurs more efficiently at the interface between the first light-emitting layer 14GH and the second light-emitting layer 14GE, so the luminous efficiency of the light-emitting element 6G is improved.

In the light-emitting element 6G according to the present embodiment, both the energy level difference H1 and the energy level difference H2 are preferably not less than 0.0 eV and not greater than 0.15 eV. That is, both the energy level difference between the first hole transport layer 10 and the second hole transport layer 12G and the energy level difference between the first light-emitting layer 14GH and the second hole transport layer 12G in the HOMO level are preferably not less than 0.0 eV and not greater than 0.15 eV. According to the configuration described above, the positive holes from the anode electrode 8 can be reduced from remaining in the first hole transport layer 10 or the second hole transport layer 12G, and the positive holes can be transported to the first light-emitting layer 14GH more efficiently.

In the light-emitting element 6G according to the present embodiment, the energy level difference H5 is preferably 0.25 eV or greater, and more preferably 0.45 eV or greater. In other words, the energy level difference between the first light-emitting layer 14GH and the second light-emitting layer 14GE in the HOMO level is preferably 0.25 eV or greater, and more preferably 0.45 eV or greater. According to the configuration described above, the outflow of positive holes from the first light-emitting layer 14GH toward the cathode electrode 20 side can be reduced more efficiently, and the density of the positive holes at the interface between the first light-emitting layer 14GH and the second light-emitting layer 14GE is improved.

Similarly, in the light-emitting element 6G according to the present embodiment, both the energy level difference E1 and the energy level difference E2 are preferably not less than 0.0 eV and not greater than 0.15 eV. In other words, both the energy level difference between the first electron transport layer 16 and the second electron transport layer 18 and the energy level difference between the second light-emitting layer 14GE and the first electron transport layer 16 in the LUMO level are preferably not less than 0.0 eV and not greater than 0.15 eV. According to the configuration described above, the electrons from the cathode electrode 20 can be reduced from remaining in the first electron transport layer 16 or the second electron transport layer 18, and the electrons can be transported to the second light-emitting layer 14GE more efficiently.

In the light-emitting element 6G according to the present embodiment, the energy level difference E5 is preferably 0.25 eV or greater, and more preferably 0.35 eV or greater. In other words, the energy level difference between the first light-emitting layer 14GH and the second light-emitting layer 14GE in the LUMO level is preferably 0.25 eV or greater, and more preferably 0.35 eV or greater. According to the configuration described above, the outflow of electrons from the second light-emitting layer 14GE toward the anode electrode 8 side can be reduced more efficiently, and the density of the electrons at the interface between the first light-emitting layer 14GH and the second light-emitting layer 14GE is improved.

In the light-emitting element 6G, recombination of the positive holes and electrons occurs at the interface between the first light-emitting layer 14GH and the second light-emitting layer 14GE. For this reason, light having energy corresponding to a difference between the value of the LUMO level of the second light-emitting layer 14GE and the value of the HOMO level of the first light-emitting layer 14GH is generated from the light-emitting layer 14G. The difference between the value of the LUMO level of the light-emitting layer 14B, the value of the LUMO level of the second light-emitting layer 14GE, and the value of the HOMO level of the first light-emitting layer 14GH is preferably not less than 2.4 eV and not greater than 2.7 eV.

Note that in the light-emitting element 6G, the value of the HOMO level of the first electron transport layer 16 may be greater than the value of the HOMO level of the second electron transport layer 18. The value of the HOMO level of the second light-emitting layer 14GE may be greater than the value of the HOMO level of the first electron transport layer 16. As a result, the energy level difference H3 from the second light-emitting layer 14GE to the first electron transport layer 16 and the energy level difference H4 from the first electron transport layer 16 to the second electron transport layer 18 are present in the light-emitting element 6G. Thus, according to the configuration described above, the light-emitting element 6G can further reduce the outflow of positive holes from the second light-emitting layer 14GE toward the cathode electrode 20 side.

Similarly, in the light-emitting element 6G, the value of the LUMO level of the first hole transport layer 10 may be greater than the value of the LUMO level of the second hole transport layer 12G. The value of the LUMO level of the second hole transport layer 12G may be greater than the value of the LUMO level of the first light-emitting layer 14GH. As a result, the energy level difference E3 from the first light-emitting layer 14GH to the second hole transport layer 12G and the energy level difference E4 from the second hole transport layer 12G to the first hole transport layer 10 are present in the light-emitting element 6G. Thus, according to the configuration described above, the light-emitting element 6G can further reduce the outflow of electrons from the first light-emitting layer 14GH toward the anode electrode 8 side.

An example of the light-emitting device 2 according to the present embodiment will be described in contrast to a comparative example of a light-emitting device 24 according to the following comparative embodiment. At first, the light-emitting device 24 according to the comparative embodiment will be described with reference to FIG. 3.

Figure 3:
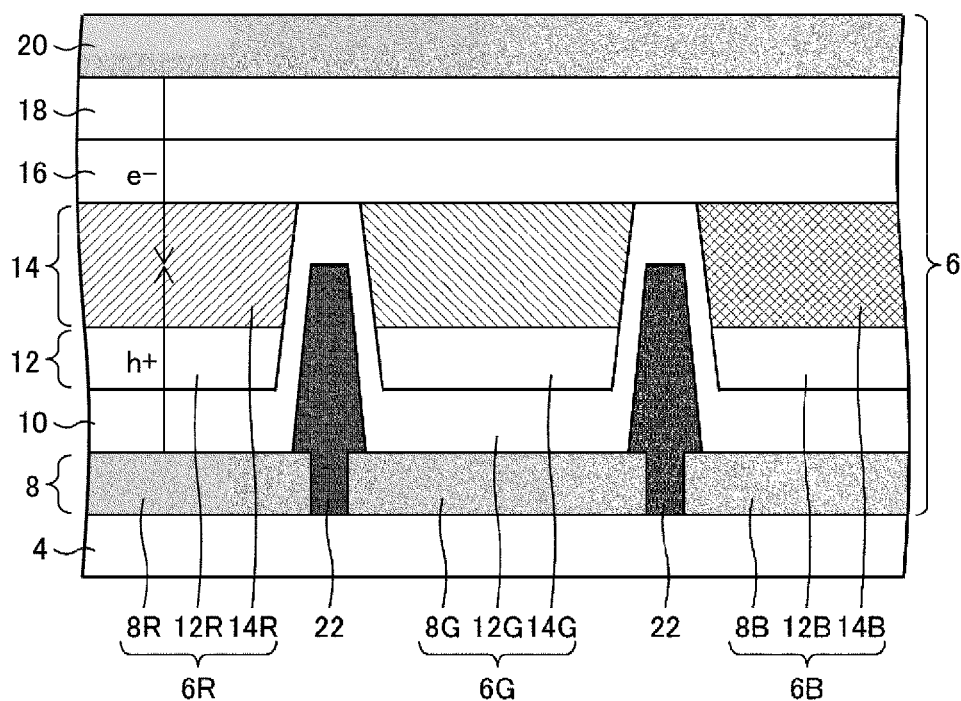
FIG. 3 is a schematic cross-sectional view of a light-emitting device according to a comparative embodiment of the disclosure.

FIG. 3 is a cross-sectional view of the light-emitting device 24 according to the comparative embodiment in the position corresponding to (b) of FIG. 1. As illustrated in FIG. 3, the light-emitting device 24 according to the comparative embodiment differs in configuration from the light-emitting device 2 according to the present embodiment in that the light-emitting layer 14G is a single layer. As described in more detail below, the light-emitting device 24 according to the comparative embodiment differs in the energy band in each layer of the light-emitting element layer 6 compared to the light-emitting device 2 according to the present embodiment. Except the above, the light-emitting device 24 according to the comparative embodiment has the same configuration as that of the light-emitting device 2 according to the present embodiment.

Figure 4:
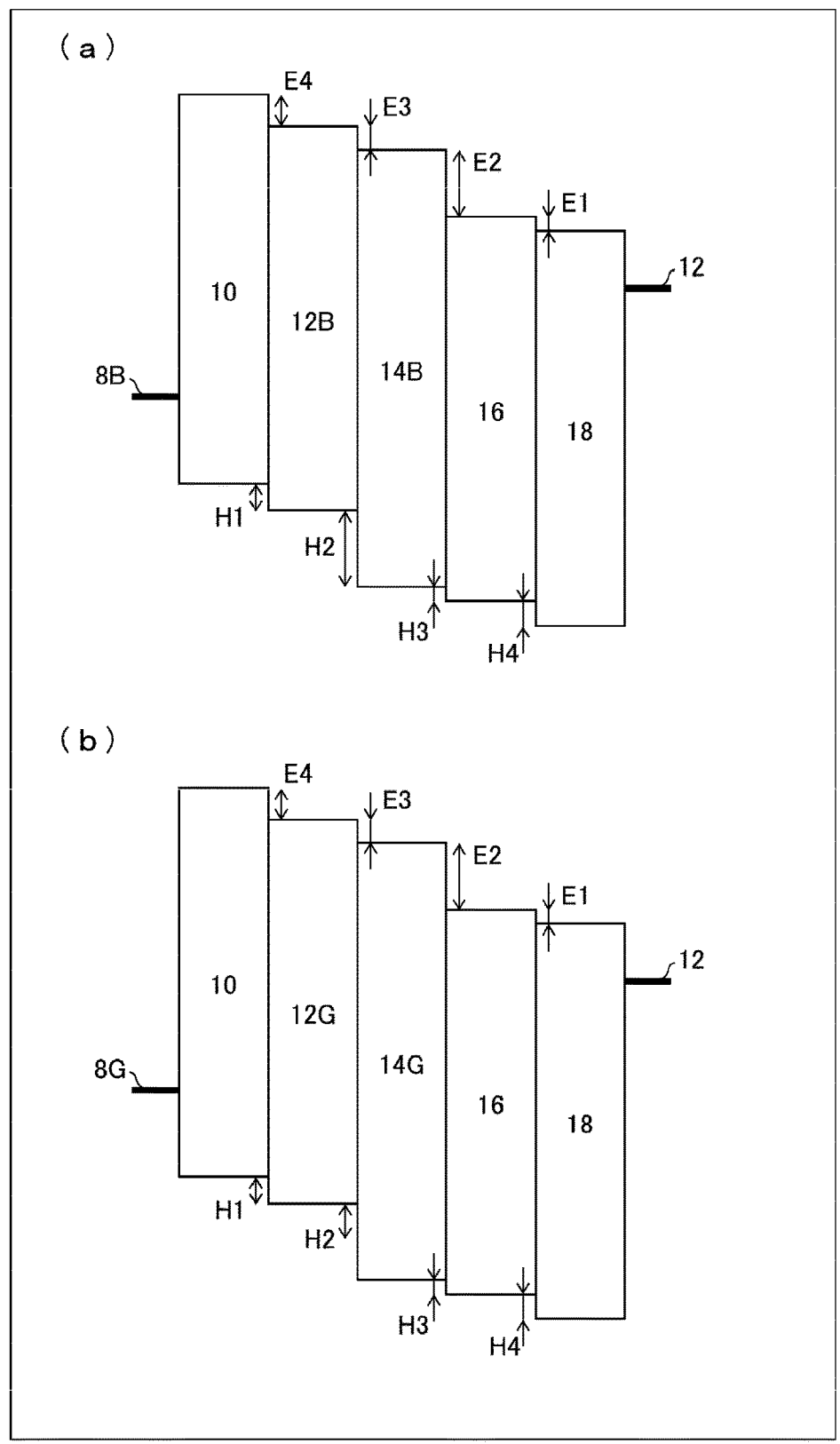
FIG. 4 is an energy diagram illustrating an example of the Fermi level, or the LUMO level and the HOMO level, of each layer in the light-emitting elements of the light-emitting device according to the comparative embodiment of the disclosure.

Next, an energy band in each layer of each light-emitting element included in the light-emitting element layer 6 of the light-emitting device 24 according to the comparative embodiment will be described with reference to FIG. 4. (a) of FIG. 4 is an energy band diagram illustrating an example of the Fermi level or the band gap in each layer of the light-emitting element 6B of the light-emitting device 24 according to the comparative embodiment. (b) of FIG. 4 is an energy band diagram illustrating an example of the Fermi level or the band gap in each layer of the light-emitting element 6G of the light-emitting device 24 according to the comparative embodiment.

As illustrated in FIG. 4, in the light-emitting element 6B of the light-emitting device 24 according to the comparative embodiment, the energy level difference H3 is smaller than the energy level difference H2. In other words, in the light-emitting element 6B, the energy level difference between the light-emitting layer 14B and the first electron transport layer 16 in the HOMO level is smaller than the energy level difference between the second hole transport layer 12B and the light-emitting layer 14B.

Thus, in the light-emitting element 6B of the light-emitting device 24 according to the comparative embodiment, the hole injection from the second hole transport layer 12B into the light-emitting layer 14B is less likely to occur compared to the light-emitting element 6B of the light-emitting device 2 according to the present embodiment. Furthermore, in the light-emitting element 6B of the light-emitting device 24 according to the comparative embodiment, the outflow of positive holes from the light-emitting layer 14B to the first electron transport layer 16 is more likely to occur compared to the light-emitting element 6B of the light-emitting device 2 according to the present embodiment.

As illustrated in FIG. 4, in the light-emitting element 6G of the light-emitting device 24 according to the comparative embodiment, the energy level difference H3 is smaller than the energy level difference H2. In other words, in the light-emitting element 6G, the energy level difference between the light-emitting layer 14G and the first electron transport layer 16 in the HOMO level is smaller than the energy level difference between the second hole transport layer 12G and the first light-emitting layer 14G.

Thus, in the light-emitting element 6G of the light-emitting device 24 according to the comparative embodiment, the electron injection from the first electron transport layer 16 into the light-emitting layer 14G is less likely to occur compared to the light-emitting element 6G of the light-emitting device 2 according to the present embodiment. Furthermore, in the light-emitting element 6G of the light-emitting device 24 according to the comparative embodiment, the outflow of positive holes from the light-emitting layer 14G to the second hole transport layer 12G is more likely to occur compared to the light-emitting element 6G of the light-emitting device 2 according to the present embodiment.

From the above, in the light-emitting device 24 according to the comparative embodiment, the density of the positive holes and electrons in the light-emitting layer 14 is reduced. For this reason, the luminous efficiency of the light-emitting device 24 according to the comparative embodiment is reduced.

In the light-emitting device 24 according to the comparative embodiment, the retention of the positive holes is more likely to occur in the second hole transport layer 12. Many positive holes may remain in the same layer for a long period of time, which can lead to cleavage of chemical bonds in the organic molecules of the layer, in particular a bonds, which may cause degradation of the layer. This reduces the lifespan of the light-emitting device 24.

Similarly, in the light-emitting device 24 according to the comparative embodiment, the retention of the electrons is more likely to occur in the first electron transport layer 16. Many electrons can remain in the same layer for a long period of time, which can cause the electrons to uptake oxygen molecules and degrade the layer. This reduces the lifespan of the light-emitting device 24.

Furthermore, in the light-emitting device 24 according to the comparative embodiment, even in a case where only one of the density of the positive holes or the density of the electrons in the light-emitting layer 14 is improved, the luminous efficiency is less improved because the balance of carriers in the light-emitting layer 14 is poor. In addition, in a case where only one carrier is too much in the light-emitting layer 14, the carrier stays in the light-emitting layer 14 for a long period of time. For this reason, in a case where only one of the density of the positive holes or the density of the electrons in the light-emitting layer 14 is improved, deterioration of the light-emitting layer 14 occurs and the lifespan of the light-emitting device 24 is reduced due to the reasons described above.

In order to compare each light-emitting element of the light-emitting device 2 according to the present embodiment to each light-emitting element of the light-emitting device 24 according to the comparative embodiment, light-emitting elements according to each of Examples 1 to 4 and Comparative Examples 1 and 2 below were produced, and the physical properties thereof were measured.

Example 1

The light-emitting element according to the present example has the same configuration as the light-emitting element 6B of the light-emitting device 2 according to the present embodiment.

In the manufacturing of the light-emitting element according to the present example, ITO was first formed as an anode electrode 8.

Next, a first hole transport layer 10 (HOMO: −5.50 eV, LUMO: −2.42 eV) containing an aromatic amine based compound was film formed as a hole transport material on the anode electrode 8 by deposition of a low-temperature CVD method of the hole transport material.

Next, a second hole transport layer 12B (HOMO: −5.60 eV, LUMO: −2.52 eV) containing a carbazole based compound was film formed as an electron blocking material on the upper layer of the first hole transport layer 10 by deposition of a low-temperature CVD method of the electron blocking material.

Next, a light-emitting layer 14B was formed on the upper layer of the second hole transport layer 12B. The light-emitting layer 14B was formed by codeposition of an anthracene-adamantane based compound (HOMO: −5.74 eV, LUMO: −2.88 eV) serving as a host material and an anthracene-naphthalene based compound (HOMO: −5.85 eV, LUMO: −2.90 eV) serving as a fluorescence emission dopant.

Next, a first electron transport layer 16 (HOMO: −6.00 eV, LUMO: −2.95 eV) containing a triazole based compound was formed as a hole blocking material on the upper layer of the light-emitting layer 14B by vapor deposition of the hole blocking material.

Next, a second electron transport layer 18 (HOMO: −6.34 eV, LUMO: −2.96 eV) containing an oxadiazole compound was formed as an electron transport material on the upper layer of the first electron transport layer 16 by vapor deposition of the electron transport material.

In the present example, lithium fluoride was further deposited on the upper layer of the second electron transport layer 18 to form an electron injection layer.

An alloy of Mg—Ag was then deposited on the upper layer of the electron injection layer to form a cathode electrode 20.

In the present example, a capping layer formed from a compound containing an aromatic amine group was further formed by vapor deposition on the upper layer of the cathode electrode 20, and the light-emitting element was then sealed using a sealing material containing an inorganic-organic composite material.

In the present example, a light-emitting element was obtained that emits light of (x, y)=(0.140, 0.050) in chromaticity coordinates of the CIE. Note that in the present example, the difference between the value of the LUMO level of the light-emitting layer 14B and the value of the HOMO level of the light-emitting layer 14B was 2.95 eV.

Example 2

The light-emitting element according to the present example has the same configuration as the light-emitting element 6B of the light-emitting device 2 according to the present embodiment.

In the manufacturing of the light-emitting element according to the present example, ITO was first formed as an anode electrode 8.

Next, a first hole transport layer 10 (HOMO: −5.49 eV, LUMO: −2.41 eV) containing an aromatic amine based compound was film formed as a hole transport material on the anode electrode 8 by deposition of a low-temperature CVD method of the hole transport material.

Next, a second hole transport layer 12B (HOMO: −5.62 eV, LUMO: −2.53 eV) containing a carbazole based compound was film formed as an electron blocking material on the upper layer of the first hole transport layer 10 by deposition of a low-temperature CVD method of the electron blocking material.

Next, a light-emitting layer 14B was formed on the upper layer of the second hole transport layer 12B. The light-emitting layer 14B was formed by codeposition of an anthracene-phenyl based compound (HOMO: −5.74 eV, LUMO: −2.82 eV) serving as a host material and a rubrene based compound (HOMO: −5.80 eV, LUMO: −2.86 eV) serving as a fluorescence emission dopant.

Next, a first electron transport layer 16 (HOMO: −6.07 eV, LUMO: −2.87 eV) containing a triazole based compound was formed as a hole blocking material on the upper layer of the light-emitting layer 14B by vapor deposition of the hole blocking material.

Next, a second electron transport layer 18 (HOMO: −6.35 eV, LUMO: −2.88 eV) containing an oxadiazole compound was formed as an electron transport material on the upper layer of the first electron transport layer 16 by vapor deposition of the electron transport material.

In the present example, ytterbium (Yb) was further deposited on the upper layer of the second electron transport layer 18 to form an electron injection layer.

The formation of the cathode electrode 20 and the capping layer on the upper layer of the electron injection layer and sealing of the light-emitting element by the sealing material were performed by the same methods as in the previous example.

In the present example, a light-emitting element was obtained that emits light of (x, y)=(0.136, 0.048) in chromaticity coordinates of the CIE. Note that in the present example, the difference between the value of the LUMO level of the light-emitting layer 14B and the value of the HOMO level of the light-emitting layer 14B was 2.94 eV.

Example 3

The light-emitting element according to the present example has the same configuration as the light-emitting element 6G of the light-emitting device 2 according to the present embodiment.

In the manufacturing of the light-emitting element according to the present example, ITO was first formed as an anode electrode 8.

Next, a first hole transport layer 10 (HOMO: −5.50 eV, LUMO: −2.42 eV) containing an aromatic amine based compound was film formed as a hole transport material on the anode electrode 8 by deposition of a low-temperature CVD method of the hole transport material.

Next, a second hole transport layer 12G (HOMO: −5.60 eV, LUMO: −2.47 eV) containing a carbazole based compound was film formed as an electron blocking material on the upper layer of the first hole transport layer 10 by deposition of a low-temperature CVD method of the electron blocking material.

Next, the light-emitting layer 14G was formed by sequentially forming the first light-emitting layer 14GH and the second light-emitting layer 14GE on the upper layer of the second hole transport layer 12G. The light-emitting layer 14G was formed by codeposition of three materials of a rubrene based compound (HOMO: −5.60 eV, LUMO: −2.34 eV) serving as a hole transport material, Alq3 (tris(8-hydroxyquinolinato) aluminum) (HOMO: −5.96 eV, LUMO: −2.84 eV) serving as an electron transport material, and an iridium complex (HOMO: −5.60 eV, LUMO: −2.90 eV) serving as a phosphorescence emission dopant.

Next, a first electron transport layer 16 (HOMO: −6.02 eV, LUMO: −2.94 eV) containing a triazole based compound was formed as a hole blocking material on the upper layer of the light-emitting layer 14G by vapor deposition of the hole blocking material.

Next, a second electron transport layer 18 (HOMO: −6.34 eV, LUMO: −2.95 eV) containing an oxadiazole compound was formed as an electron transport material on the upper layer of the first electron transport layer 16 by vapor deposition of the electron transport material.

In the present example, lithium fluoride was further deposited on the upper layer of the second electron transport layer 18 to form an electron injection layer.

The formation of the cathode electrode 20 and the capping layer on the upper layer of the electron injection layer and sealing of the light-emitting element by the sealing material were performed by the same methods as in the previous example.

In the present example, a light-emitting element was obtained that emits light of (x, y)=(0.226, 0.725) in chromaticity coordinates of the CIE. Note that in the present example, the difference between the value of the LUMO level of the second light-emitting layer 14GE and the value of the HOMO level of the first light-emitting layer 14GH was 2.70 eV.

Example 4

The light-emitting element according to the present example has the same configuration as the light-emitting element 6G of the light-emitting device 2 according to the present embodiment.

In the manufacturing of the light-emitting element according to the present example, ITO was first formed as an anode electrode 8.

Next, a first hole transport layer 10 (HOMO: −5.47 eV, LUMO: −2.40 eV) containing an aromatic amine based compound was film formed as a hole transport material on the anode electrode 8 by deposition of a low-temperature CVD method of the hole transport material.

Next, a second hole transport layer 12G (HOMO: −5.60 eV, LUMO: −2.52 eV) containing a carbazole based compound was film formed as an electron blocking material on the upper layer of the first hole transport layer 10 by deposition of a low-temperature CVD method of the electron blocking material.

Next, the light-emitting layer 14G was formed by sequentially forming the first light-emitting layer 14GH and the second light-emitting layer 14GE on the upper layer of the second hole transport layer 12G. The light-emitting layer 14G was formed by codeposition of three materials of a rubrene based compound (HOMO: −5.59 eV, LUMO: −2.46 eV) serving as a hole transport material, a starburst type oxadiazole based compound (HOMO: −5.90 eV, LUMO: −2.90 eV) serving as an electron transport material, and an iridium complex (HOMO: −5.60 eV, LUMO: −2.90 eV) serving as a phosphorescence emission dopant.

Next, a first electron transport layer 16 (HOMO: −6.03 eV, LUMO: −3.03 eV) containing a triazole based compound was formed as a hole blocking material on the upper layer of the light-emitting layer 14G by vapor deposition of the hole blocking material.

Next, a second electron transport layer 18 (HOMO: −6.32 eV, LUMO: −3.03 eV) containing an oxadiazole compound was formed as an electron transport material on the upper layer of the first electron transport layer 16 by vapor deposition of the electron transport material.

In the present example, ytterbium (Yb) was further deposited on the upper layer of the second electron transport layer 18 to form an electron injection layer.

The formation of the cathode electrode 20 and the capping layer on the upper layer of the electron injection layer and sealing of the light-emitting element by the sealing material were performed by the same methods as in the previous example.

In the present example, a light-emitting element was obtained that emits light of (x, y)=(0.210, 0.705) in chromaticity coordinates of the CIE. Note that in the present example, the difference between the value of the LUMO level of the second light-emitting layer 14GE and the value of the HOMO level of the first light-emitting layer 14GH was 2.82 eV.

Comparative Example 1

The light-emitting element according to the present comparative example has the same configuration as the light-emitting element 6B of the light-emitting device 24 according to the comparative embodiment. The light-emitting element according to the present comparative example has the same configuration except that the material of the light-emitting layer 14B differs from the light-emitting element according to Example 1. For this reason, the light-emitting element according to the present comparative example is formed by the same method except for the method of forming the light-emitting layer 14B compared to the light-emitting element according to Example 1. In particular, in the step of forming the light-emitting element according to the present comparative example, the light-emitting layer 14B was formed by codeposition of an anthracene based compound (HOMO: −5.62 eV, LUMO: −2.68 eV) serving as a host material and a styryl based compound (HOMO: −5.72 eV, LUMO: −2.74 eV) serving as a fluorescence emission dopant.

In the present comparative example, a light-emitting element was obtained that emits light of (x, y)=(0.137, 0.055) in chromaticity coordinates of the CIE. Note that in the present comparative example, the difference between the value of the LUMO level of the light-emitting layer 14B and the value of the HOMO level of the light-emitting layer 14B was 2.98 eV.

Comparative Example 2

The light-emitting element according to the present comparative example has the same configuration as the light-emitting element 6G of the light-emitting device 24 according to the comparative embodiment. The light-emitting element according to the present comparative example has the same configuration except that the configuration of the light-emitting layer 14G differs from the light-emitting element according to Example 3. For this reason, the light-emitting element according to the present comparative example is formed by the same method except for the method of forming the light-emitting layer 14G compared to the light-emitting element according to Example 3. In particular, in the step of forming the light-emitting element according to the present comparative example, the light-emitting layer 14G was formed by codeposition of a dimerized anthracene compound (HOMO: −5.60 eV, LUMO: −2.64 eV) serving as a host material and an iridium complex (HOMO: −5.76 eV, LUMO: −2.86 eV) serving as a phosphorescence emission dopant.

In the present comparative example, a light-emitting element was obtained that emits light of (x, y)=(0.221, 0.717) in chromaticity coordinates of the CIE. Note that in the present comparative example, the difference between the value of the LUMO level of the light-emitting layer 14G and the value of the HOMO level of the light-emitting layer 14G was 2.90 eV.

Next, the physical properties of the light-emitting elements according to the examples and the comparative examples described above were measured, and the physical properties thereof were compared.

First, the values of the HOMO level and the LUMO level of each layer of each light-emitting element were measured, and the HOMO level difference and the LUMO level difference between each layer were measured. Specifically, a Photoemission Yield Spectroscopy (PYS) apparatus (AC-3, available from RIKEN KEIKI Co., Ltd.) was used to determine the value of the HOMO level of each layer of each light-emitting element. Furthermore, the value of the LUMO level was determined by measuring the band gap of each layer of each light-emitting element by the ultraviolet spectrum measurement.

Figure 5:
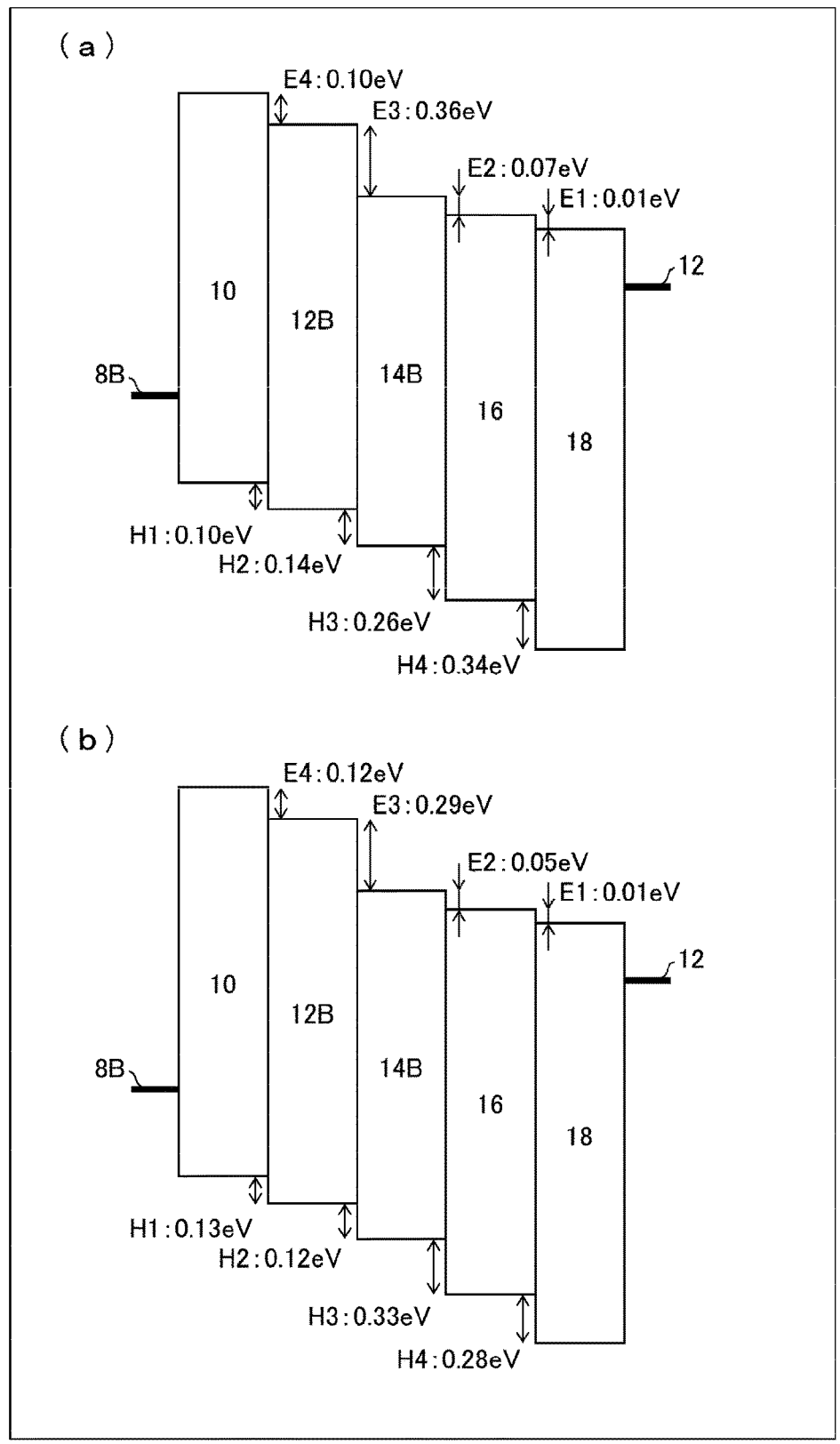
FIG. 5 is an energy diagram illustrating an example of the Fermi level, or the LUMO level and the HOMO level, of each layer in the light-emitting elements according to each of Example 1 and Example 2.
Figure 6:
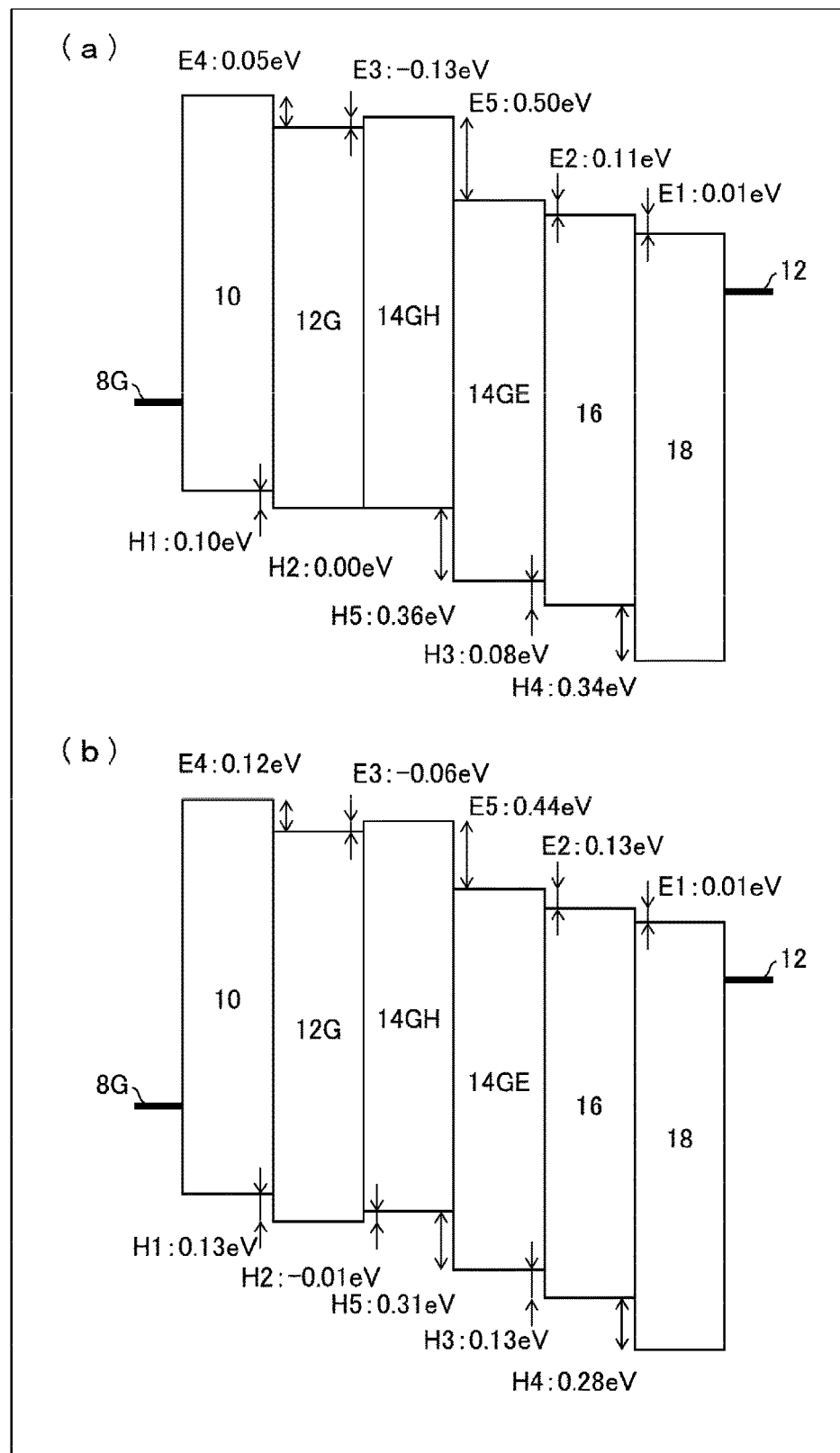
FIG. 6 is an energy diagram illustrating an example of the Fermi level, or the LUMO level and the HOMO level, of each layer in the light-emitting elements according to each of Example 3 and Example 4.
Figure 7:
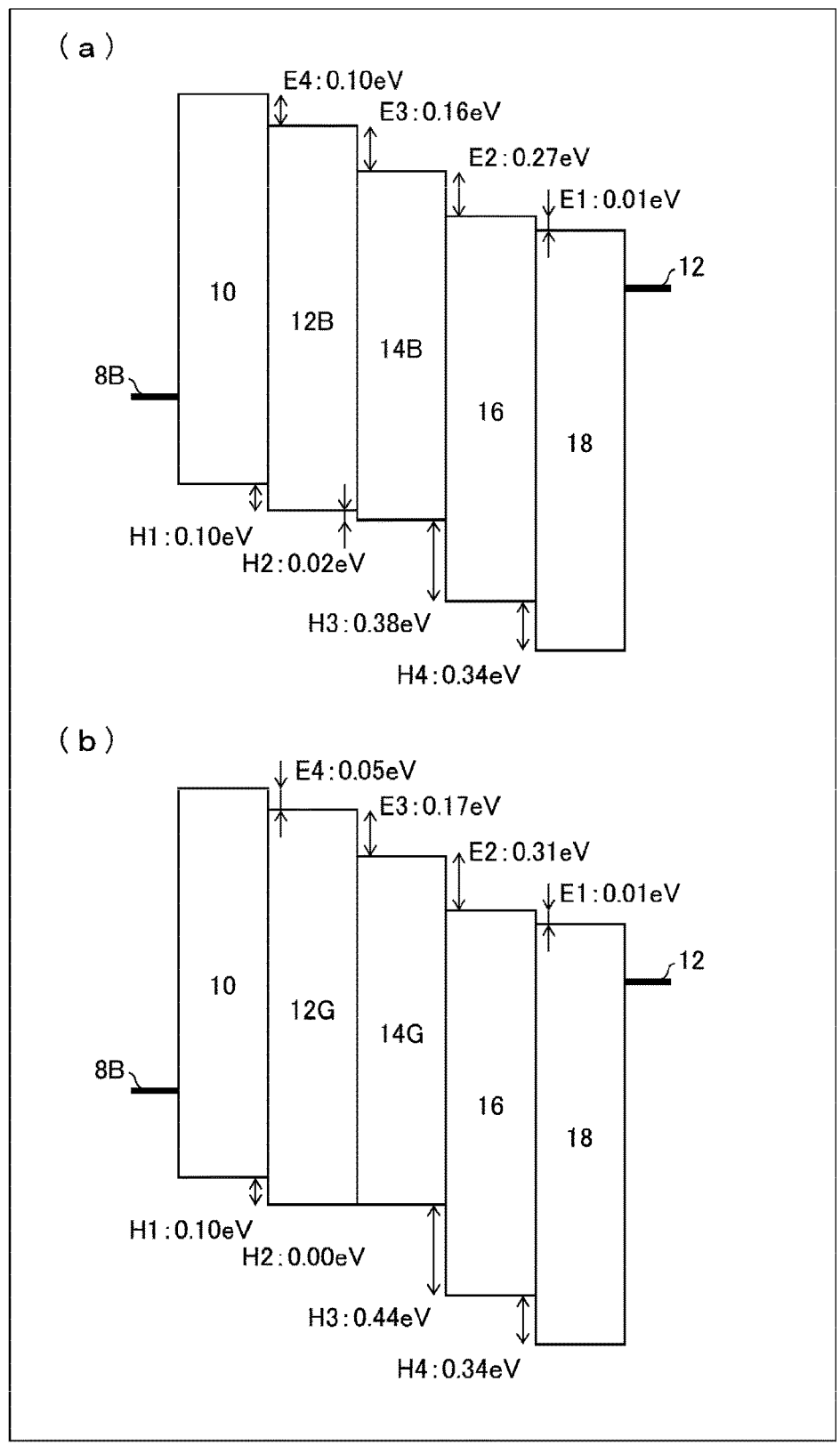
FIG. 7 is an energy diagram illustrating an example of the Fermi level, or the LUMO level and the HOMO level, of each layer in the light-emitting elements according to each of Comparative Example 1 and Comparative Example 2.

The energy diagrams of each layer of the light-emitting elements according to each of the examples and the comparative examples based on the results of the measurement are illustrated in FIGS. 5 to 7. (a) of FIG. 5, (b) of FIG. 5, (a) of FIG. 6, and (b) of FIG. 6 respectively illustrate energy diagrams of each layer of the light-emitting elements according to each of Example 1, Example 2, Example 3, and Example 4. (a) of FIG. 7 and (b) of FIG. 7 respectively illustrate energy diagrams of each layer of the light-emitting elements according to each of Comparative Example 1 and Comparative Example 2.

Next, under an environmental temperature of 25 degrees Celsius, a voltage generated by a current having a current density of 10 mA/cm$^2$ was applied between electrodes of each of the light-emitting elements, and the external quantum efficiency and the lifespan were measured.

The physical properties of the light-emitting elements according to each of the examples and the comparative examples measured are listed in Table 1 below.

TABLE 1

|  | EXAMPLE 1 | EXAMPLE 2 | COMPARATIVE EXAMPLE 1 | EXAMPLE 3 | EXAMPLE 4 | COMPARATIVE EXAMPLE 2 |
|---|---|---|---|---|---|---|
| H1(eV) | 0.10 | 0.13 | 0.10 | 0.10 | 0.13 | 0.10 |
| H2(eV) | 0.14 | 0.12 | 0.02 | 0.00 | −0.01 | 0.00 |
| H3(eV) | 0.26 | 0.33 | 0.38 | 0.08 | 0.13 | 0.44 |
| H4(eV) | 0.34 | 0.28 | 0.34 | 0.34 | 0.28 | 0.34 |
| H5(eV) |  |  |  | 0.36 | 0.31 |  |
| E1(eV) | 0.01 | 0.01 | 0.01 | 0.01 | 0.01 | 0.01 |
| E2(eV) | 0.07 | 0.05 | 0.27 | 0.11 | 0.13 | 0.31 |
| E3(eV) | 0.36 | 0.29 | 0.16 | −0.13 | −0.06 | 0.17 |
| E4(eV) | 0.10 | 0.12 | 0.1 | 0.05 | 0.12 | 0.05 |
| E5(eV) |  |  |  | 0.5 | 0.44 |  |
| VOLTAGE (V) | 4.2 | 4.0 | 4.6 | 4.3 | 4.6 | 4.7 |
| EQE (%) | 13.3 | 12.9 | 11 | 34.1 | 31.7 | 27.6 |
| LIFESPAN (h) | 3200 | 3700 | 850 | 3800 | 3950 | 1600 |

In Table 1, the columns of "Example 1" to "Example 4", "Comparative Example 1", and "Comparative Example 2" indicate the physical properties of the light-emitting elements according to the respective examples or comparative examples.

In Table 1, the rows of "H1" to "H5" and "E1" to "E5" indicate energy values of the energy level differences H1 to H5 and energy level differences E1 to E5, respectively, as units of eV. Note that in Example 4, the value of the row of "H2" being negative indicates that the value of the HOMO level of the second hole transport layer 12G is smaller than the value of the HOMO level of the first light-emitting layer 14GH. In Example 3 and Example 4, the values of the row of "E3" being negative indicates that the value of the LUMO level of the second hole transport layer 12G is smaller than the value of the LUMO level of the first light-emitting layer 14GH.

In Table 1, the row of "voltage" indicates the magnitude of the voltage required to generate a current with a current density of 10 mA/cm$^2$ between the electrodes of each light-emitting element as units of V. The row of "EQE" indicates the percentage of external quantum efficiency of each light-emitting element under the application of the above voltage. The row of "lifespan" indicates the duration until the luminance of each light-emitting element reaches 90 percent of the initial luminance under the application of the above voltage as units of time (h).

As is clear from Table 1 and FIG. 5, in the light-emitting elements according to both Example 1 and Example 2, the energy level difference H3 is greater than the energy level difference H2, and the energy level difference E3 is greater than the energy level difference E2. For this reason, in the light-emitting elements, both positive holes and electrons are efficiently transported from each electrode to the light-emitting layer 14B, and the retention of the positive holes or electrons in certain layers is reduced. For this reason, the light-emitting elements according to Example 1 and Example 2 achieve an external quantum efficiency of approximately 13 percent, and has a lifespan of 3000 hours or longer.

On the other hand, as is clear from Table 1 and (a) of FIG. 7, in the light-emitting elements according to Comparative Example 1, although the energy level difference H3 is greater than the energy level difference H2, the energy level difference E2 is larger than the energy level difference E3. For this reason, in the light-emitting elements, electrons are difficult to be transported to the light-emitting layer 14B, and the retention of the electrons is more likely to occur in the first electron transport layer 16, leading to deterioration of the first electron transport layer 16. In addition, in the light-emitting elements, there are too many positive holes in the light-emitting layer 14B, and the luminous efficiency is reduced, leading to deterioration of the light-emitting layer 14B. For this reason, the light-emitting elements according to Comparative Example 1 has an external quantum efficiency of approximately 11 percent, and only lifespan of 850 hours is obtained.

Similarly, as is clear from Table 1 and FIG. 6, in the light-emitting elements according to both Example 3 and Example 4, the energy level difference H5 is greater than the energy level difference H2, and the energy level difference E5 is greater than the energy level difference E2. For this reason, in the light-emitting elements, both positive holes and electrons are efficiently transported from each electrode to the interface between the first light-emitting layer 14GH and the second light-emitting layer 14GE, and the retention of the positive holes or electrons in certain layers is reduced. For this reason, the light-emitting elements according to Example 3 and Example 4 achieve an external quantum efficiency of not less than 30 percent, and has a lifespan of approximately 4000 hours.

On the other hand, as is clear from Table 1 and (b) of FIG. 7, in the light-emitting elements according to Comparative Example 2, although the energy level difference H3 is greater than the energy level difference H2, the energy level difference E2 is larger than the energy level difference E3. For this reason, in the light-emitting elements, electrons are difficult to be transported to the light-emitting layer 14G, and the retention of the electrons is more likely to occur in the first electron transport layer 16, leading to deterioration of the first electron transport layer 16. In addition, in the light-emitting elements, there are too many positive holes in the light-emitting layer 14G, and the luminous efficiency is reduced, leading to deterioration of the light-emitting layer 14G. For this reason, the light-emitting elements according to Comparative Example 2 has an external quantum efficiency of approximately 27 percent, and only lifespan of 1600 hours is obtained.

As described above, the light-emitting elements according to each of Examples 1 to 4 have higher external quantum efficiencies and longer lifespans compared to the light-emitting elements according to Comparative Examples 1 and 2.

Second Embodiment

Figure 8:
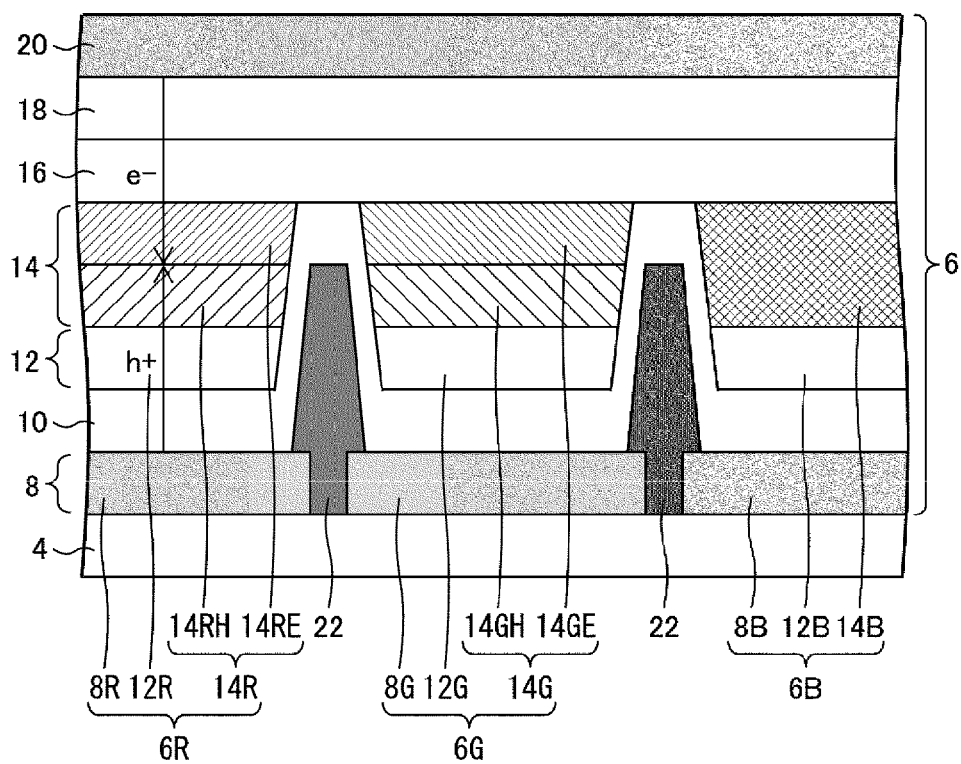
FIG. 8 is a schematic cross-sectional view of a light-emitting device according to a second embodiment of the disclosure.

FIG. 8 is a cross-sectional view of the light-emitting device 2 according to the present embodiment in the position corresponding to (b) of FIG. 1. As illustrated in FIG. 8, the light-emitting device 2 according to the present embodiment differs in configuration from the light-emitting device 2 according to the previous embodiment in that the light-emitting layer 14R includes a first light-emitting layer 14RH and a second light-emitting layer 14RE from the anode electrode 8 side. Except the above, the light-emitting device 2 according to the present embodiment has the same configuration as that of the light-emitting device 2 according to the previous embodiment.

In the present embodiment, the first light-emitting layer 14RH is a hole transport type red light-emitting layer, and the second light-emitting layer 14RE is an electron transport type red light-emitting layer. The light-emitting element 6R according to the present embodiment may have the same configuration as the light-emitting element 6B except that the light from the first light-emitting layer 14RH and the second light-emitting layer 14RE is red light. For example, the magnitude relationship between the value of the LUMO level and the value of the HOMO level of each layer of the light-emitting element 6R may be the same as that of the light-emitting element 6G. In the light-emitting element 6R, the energy level difference H5 may be greater than the energy level difference H2, and the energy level difference E5 may be greater than the energy level difference E2. For this reason, even in the light-emitting element 6R, the lifespan becomes longer, and the luminous efficiency is improved.

By the light-emitting device 2 including the light-emitting element 6R, the light-emitting element 6G, and the light-emitting element 6B according to the embodiments described above, the light-emitting device 2 having a higher luminous efficiency and improved lifespan is obtained. Note that the light-emitting device 2 may be a display device provided with one light-emitting element 6R, one light-emitting element 6G, and one light-emitting element 6B described above for each of a plurality of subpixels.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A light-emitting element comprising:
an anode electrode;
a cathode electrode;
a first hole transport layer;
a second hole transport layer;
a light-emitting layer;
a first electron transport layer; and
a second electron transport layer, wherein
the first hole transport layer, the second hole transport layer, the light-emitting layer, the first electron transport layer, and the second electron transport layer are provided between the anode electrode and the cathode electrode in order from a side closer to the anode electrode,
a value of a lowest unoccupied molecular orbital (LUMO) level of the second hole transport layer is greater than a value of a LUMO level of the light-emitting layer, and a value of a LUMO level of the light-emitting layer is equal to or greater than a value of a LUMO level of the first electron transport layer,
a value of a highest occupied molecular orbital (HOMO) level of the light-emitting layer is greater than a value of a HOMO level of the first electron transport layer,
an energy level difference between the second hole transport layer and the light-emitting layer is greater than an energy level difference between the light-emitting layer and the first electron transport layer in a LUMO level,
an energy level difference between the first electron transport layer and the light-emitting layer is greater than an energy level difference between the light-emitting layer and the second hole transport layer in a HOMO level,
the light-emitting layer is a single layer,
an energy level difference between the light-emitting layer and the first electron transport layer in the LUMO level is not less than 0.0 eV and not greater than 0.15 eV, and
an energy level difference between the light-emitting layer and the second hole transport layer in the HOMO level is not less than 0.0 eV and not greater than 0.15 eV.

2. The light-emitting element according to claim 1, wherein a difference between the value of the LUMO level of the light-emitting layer and the value of the HOMO level of the light-emitting layer is greater than 2.7 eV and less than or equal to 3.1 eV.

3. The light-emitting element according to claim 1, wherein the light-emitting layer is configured to emit blue light.

4. The light-emitting element according to claim 1, wherein the light-emitting layer includes a first light-emitting layer of a hole transport type on a side closer to the second hole transport layer, and a second light-emitting layer of an electron transport type on a side closer to the first electron transport layer.

5. The light-emitting element according to claim 4, wherein an energy level difference between the first light-emitting layer and the second light-emitting layer in the LUMO level is greater than or equal to 0.25 eV, and
an energy level difference between the first light-emitting layer and the second light-emitting layer in the HOMO level is greater than or equal to 0.25 eV.

6. The light-emitting element according to claim 5, wherein the energy level difference between the first light-emitting layer and the second light-emitting layer in the LUMO level is greater than or equal to 0.35 eV, and
the energy level difference between the first light-emitting layer and the second light-emitting layer in the HOMO level is greater than or equal to 0.35 eV.

7. The light-emitting element according to claim 4, wherein both an energy level difference between the first electron transport layer and the second electron transport layer and an energy level difference between the second light-emitting layer and the first electron transport layer in the LUMO level are not less than 0.0 eV and not greater than 0.15 eV, and both an energy level difference between the first hole transport layer and the second hole transport layer and an energy level difference between the first light-emitting layer and the second hole transport layer in the HOMO level are not less than 0.0 eV and not greater than 0.15 eV.

8. The light-emitting element according to claim 4, wherein a difference between the value of the LUMO level of the second light-emitting layer and a value of a HOMO level of the first light-emitting layer is not less than 2.4 eV and not greater than 2.7 eV.

9. The light-emitting element according to claim 4, wherein the first light-emitting layer and the second light-emitting layer are configured to emit green light.

10. The light-emitting element according to claim 4, wherein the first light-emitting layer and the second light-emitting layer are configured to emit red light.

11. The light-emitting element according to claim 1, wherein a value of a LUMO level of the first hole transport layer is greater than the value of the LUMO level of the second hole transport layer, and the value of the LUMO level of the first electron transport layer is equal to or greater than a value of a LUMO level of the second electron transport layer, and a value of a HOMO level of the first hole transport layer is greater than or equal to a value of a HOMO level of the second hole transport layer, and the value of the HOMO level of the first electron transport layer is greater than a value of a HOMO level of the second electron transport layer.

12. The light-emitting element according to claim 11, wherein the energy level difference between the first electron transport layer and the second electron transport layer in the LUMO level is not less than 0.0 eV and not greater than 0.15 eV, and the energy level difference between the first hole transport layer and the second hole transport layer in the HOMO level is not less than 0.0 eV and not greater than 0.15 eV.

13. A light-emitting device comprising at least one of the light-emitting element according to claim 1.

14. A light-emitting element comprising:
an anode electrode;
a cathode electrode;
a first hole transport layer;
a second hole transport layer;
a light-emitting layer;
a first electron transport layer; and
a second electron transport layer, wherein the first hole transport layer, the second hole transport layer, the light-emitting layer, the first electron transport layer, and the second electron transport layer are provided between the anode electrode and the cathode electrode in order from a side closer to the anode electrode, a value of a lowest unoccupied molecular orbital (LUMO) level of the second hole transport layer is greater than a value of a LUMO level of a first light-emitting layer on a side closer to the second hole transport layer, and a value of a LUMO level of a second light-emitting layer on a side closer to the first electron transport layer is equal to or greater than a value of a LUMO level of the first electron transport layer, a value of a highest occupied molecular orbital (HOMO) level of the second light-emitting layer on the side closer to the first electron transport layer is greater than a value of a HOMO level of the first electron transport layer, an energy level difference between the second hole transport layer and the first light-emitting layer on the side closer to the second hole transport layer is greater than an energy level difference between the first light-emitting layer on the side closer to the second hole transport layer and the second light-emitting layer on the side closer to the first electron transport layer in a LUMO level, an energy level difference between the first electron transport layer and the second light-emitting layer on the side closer to the first electron transport layer is greater than an energy level difference between the second light-emitting layer on the sider closer the first electron transport layer and the first light-emitting layer on the side closer to the second hole transport layer in a HOMO level, the first light-emitting layer on the side closer to the second hole transport layer and the second light-emitting layer on the side closer to the first electron transport layer are the same, an energy level difference between the light-emitting layer and the first electron transport layer in the LUMO level is not less than 0.0 eV and not greater than 0.15 eV, an energy level difference between the light-emitting layer and the second hole transport layer in the HOMO level is not less than 0.0 eV and not greater than 0.15 eV, and the light-emitting layer is configured to emit red light.

* * * * *